United States Patent
Lai

(10) Patent No.: US 7,042,719 B2
(45) Date of Patent: May 9, 2006

(54) ELECTRONIC DEVICE AND MODULE STRUCTURE THEREOF

(75) Inventor: Chih-Hsi Lai, Sindian (TW)

(73) Assignee: Quanta Computer Inc., Tao Yuan Shien (TW)

( * ) Notice: Subject to any disclaimer, the term of this patent is extended or adjusted under 35 U.S.C. 154(b) by 146 days.

(21) Appl. No.: 10/792,332

(22) Filed: Mar. 3, 2004

(65) Prior Publication Data

US 2005/0094372 A1 May 5, 2005

(30) Foreign Application Priority Data

Oct. 30, 2003 (TW) .............................. 92219266 U

(51) Int. Cl.
*G06F 1/20* (2006.01)
(52) U.S. Cl. ...................... 361/687; 361/720
(58) Field of Classification Search ............... 361/687, 361/720, 709
See application file for complete search history.

(56) References Cited

U.S. PATENT DOCUMENTS

| | | | | |
|---|---|---|---|---|
| 6,122,169 A | * | 9/2000 | Liu et al. ..................... | 361/687 |
| 6,141,214 A | * | 10/2000 | Ahn ............................ | 361/687 |
| 6,151,214 A | * | 11/2000 | Yeh ............................. | 361/687 |
| 6,157,539 A | * | 12/2000 | Wagner et al. .............. | 361/687 |
| 6,252,768 B1 | * | 6/2001 | Lin ............................. | 361/687 |
| 6,373,700 B1 | * | 4/2002 | Wang ......................... | 361/687 |
| 6,549,404 B1 | * | 4/2003 | Kitahara et al. ............ | 361/687 |
| 6,556,439 B1 | * | 4/2003 | Shibasaki ................... | 361/687 |
| 6,717,815 B1 | * | 4/2004 | Yang ........................... | 361/719 |

* cited by examiner

*Primary Examiner*—Lisa Lea-Edmonds
(74) *Attorney, Agent, or Firm*—Thomas, Kayden, Horstmeyer & Risley

(57) ABSTRACT

An electronic device. The electronic device comprising a host, and a module structure is disposed in the host for calculating data. The module structure has a first substrate, a process unit, a heat-dissipating device and a second substrate. The first substrate is a motherboard of the electronic device, and the process unit is disposed on the first substrate, and the heat-dissipating device is attached to the process unit and disposed on the first substrate. The first substrate and the second substrate have the same structure and texture. The first substrate and the second substrate are blanketed from a multi-layer structure or sheet used for the motherboard.

20 Claims, 5 Drawing Sheets

ELECTRONIC DEVICE AND MODULE STRUCTURE THEREOF

BACKGROUND OF THE INVENTION

1. Field of the Invention

The present invention relates to a module structure, and in particular to a module structure of an electronic device providing a supporting element blanketed from a motherboard remainder material.

2. Description of the Related Art

Motherboards or PCBs (Printed Circuit Boards) for personal or notebook computers comprise several chips or components for processing data. A heat-dissipating module, a heat sink or the like is provided to dissipate heat generated from the mentioned components. For example, a heat-dissipating module is attached to a CPU (Central Processing Unit) and installed on a motherboard to dissipate heat generated thereby. In general, a planar support, comprising an aluminum or stainless steel plate, is mounted on one side of the motherboard opposite to the side on which the CPU is installed. Although the motherboard is deformed by heat generated by the CPU, the contact between the heat-dissipating module and the CPU is still sufficient. Further, the phenomenon of peeling of the welded points formed on the motherboard, malfunctions or overheating on the motherboard can be prevented by the heat dissipating unit.

An insulating material or mylar, however, must be further installed between the motherboard and the metallic planar support, to prevent shorts or burnout on the testing points between the motherboard and the metallic planar support. Furthermore, prior to installation of the planar support, the planar support blanketed or pressed from a metal sheet or plate must be rounded and coated with insulating material. Thus, the process is time-consuming and the cost thereof cannot be reduced.

SUMMARY OF THE INVENTION

Accordingly, an object of the invention is to provide an electronic device with a motherboard and a supporting element blanketed from the same multi-layer material or sheet.

The invention provides a host, and a module structure disposed in the host for calculating data. The module structure has a first substrate, a process unit, a heat-dissipating device and a second substrate. The first substrate is a motherboard of the electronic device. The process unit is disposed on the first substrate, and the heat-dissipating device is attached to the process unit and disposed on the first substrate. The first and second substrates are blanketed from a multi-layer structure or sheet designed to serve as a motherboard. Due to the second substrate being covered with the insulating layer, no additional insulating material or plate is required between the second substrate and the first substrate. The insulation provided by the material is sufficient to prevent shorts or burnout on the testing points between the first and second substrates.

Further, when the first substrate is blanketed from the sheet, the sheet remainder provides enough area for blanketing the second substrate, and thus it provides an economical and effective means of recycling the waste.

A detailed description is given in the following embodiments with reference to the accompanying drawings.

BRIEF DESCRIPTION OF THE DRAWINGS

The present invention is more fully understood by reading the subsequent detailed description and examples with references made to the accompanying drawings, wherein.

DETAILED DESCRIPTION OF THE INVENTION

Figure 1:
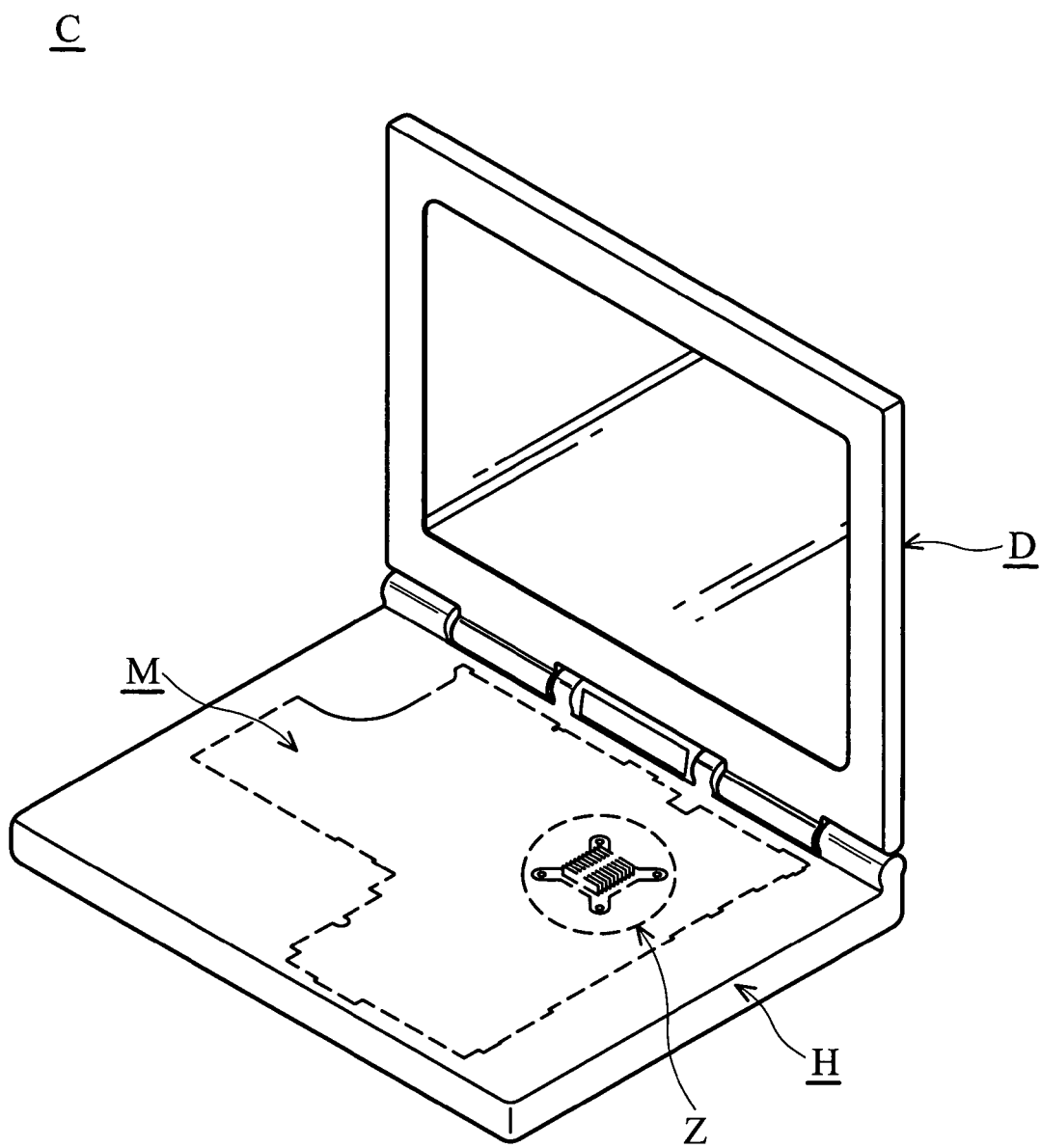
FIG. 1 is a perspective view of an electronic device (C) providing a module structure (M) according the present invention, wherein the module structure (M) is disposed in the electronic device (C)

Referring to FIG. 1, an electronic device C, such as a notebook, provides a display unit D and a host H. The display unit D is electrically connected to the host H, and a module structure M is a circuit module disposed in the host H for calculating data.

Figure 2A:
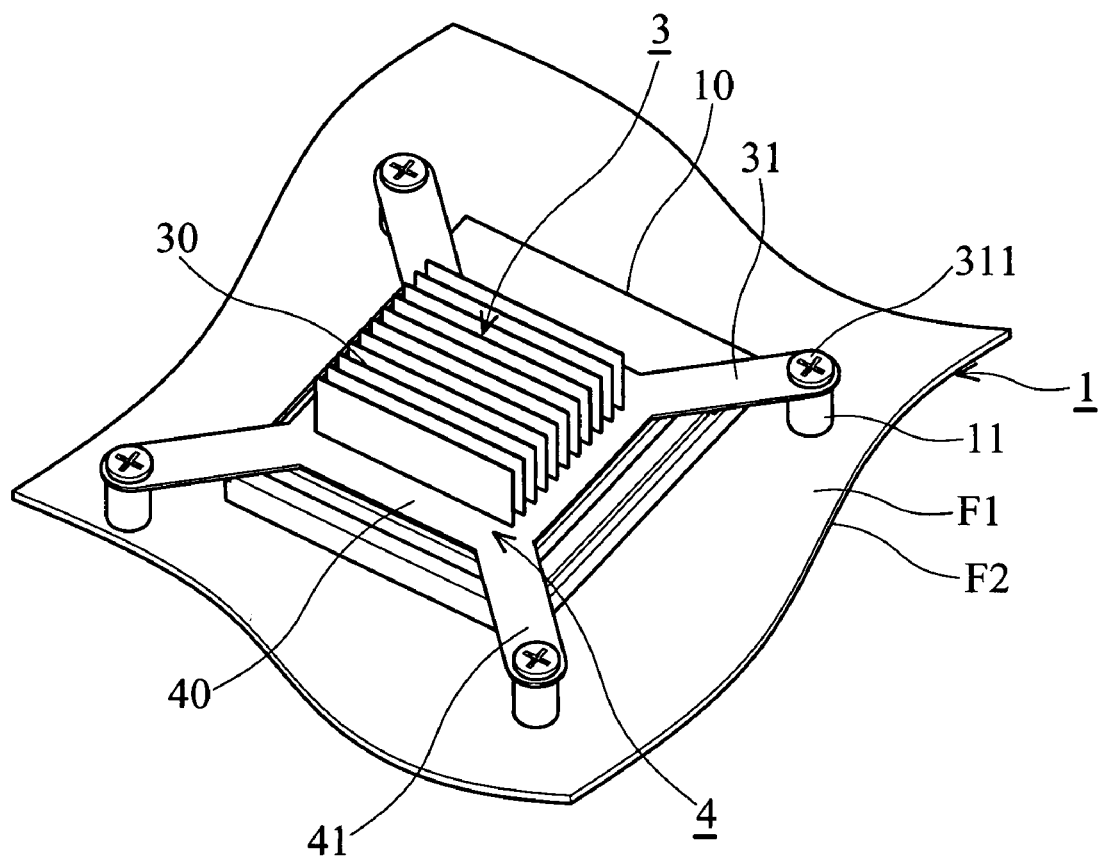
FIG. 2A is a partially enlarged perspective view of the module structure (M) according to a region (Z) in FIG. 1.
Figure 2B:
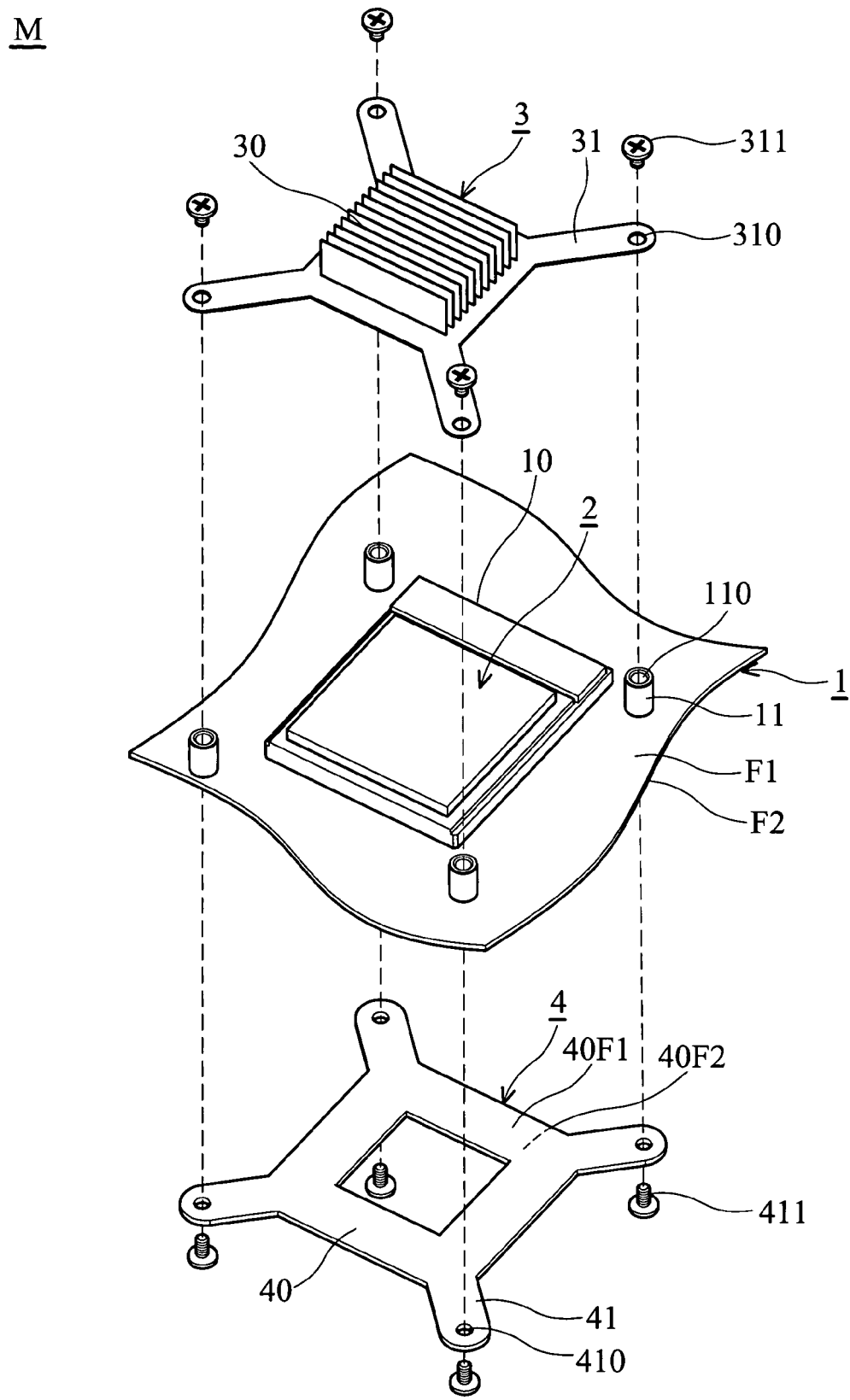
FIG. 2B is an exploded view of the module structure (M) in FIG. 2A, wherein the module structure (M) has a first substrate (1), a process unit (2), a heat-dissipating device (3) and a second substrate (4)
Figure 3A:
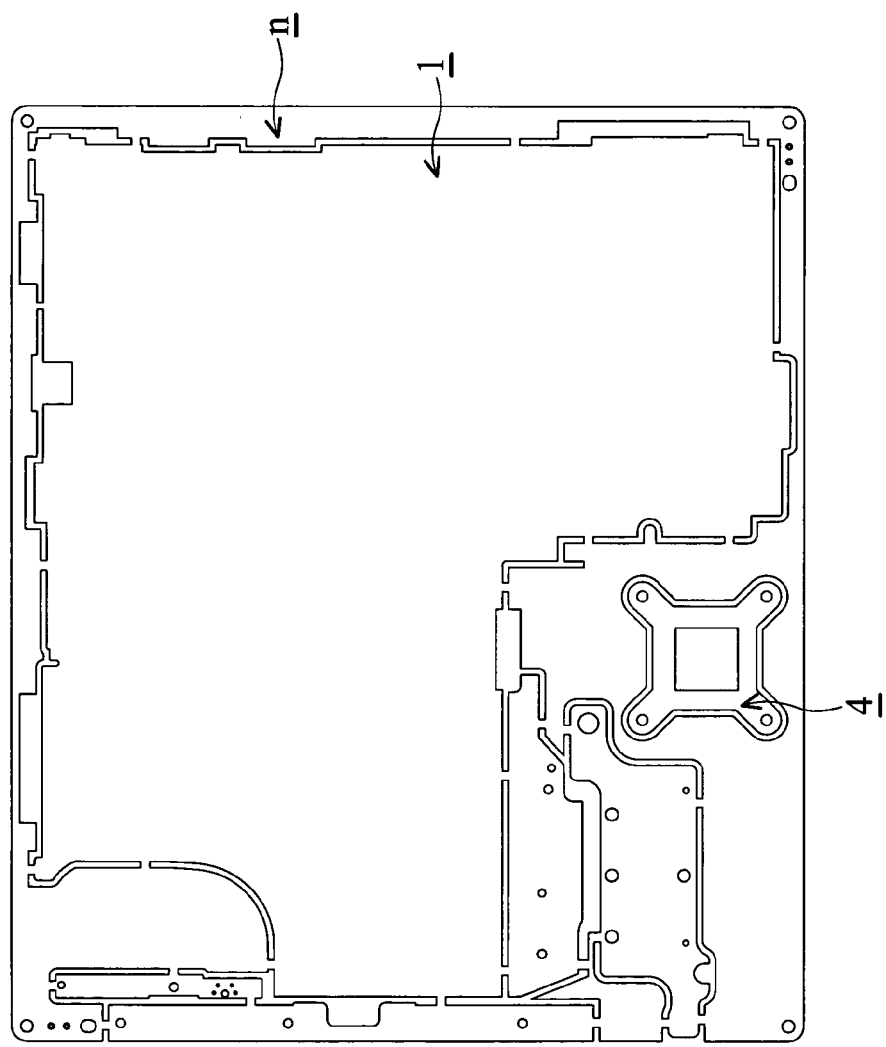
FIG. 3A is a plane view showing the first substrate (1) and the second substrate (4) of the electronic device C formed on a material (S)
Figure 3B:
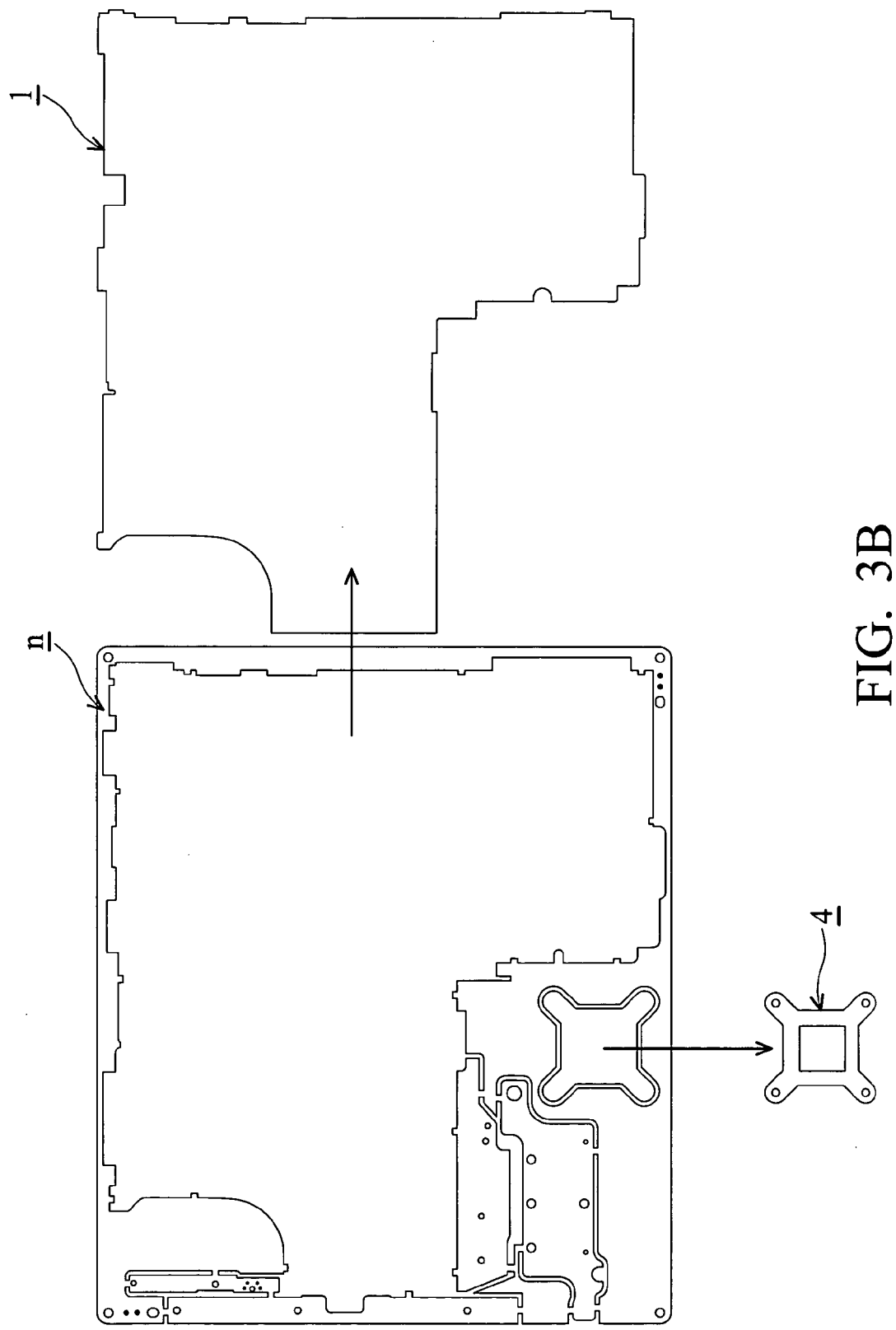
FIG. 3B is a plane view showing the first substrate (1) and the second substrate (4) removed from the material (S) according to FIG. 3A.

FIGS. 2A and 2B, show a perspective view and an exploded view of the module structure M, viewed from a region Z in FIG. 1, respectively. The module structure M has a first substrate 1, a process unit 2, a heat-dissipating device 3 and a second substrate 4. The first and second substrates 1 and 4 have the same structure and texture. In this embodiment, the first and second substrates 1 and 4 are blanketed from a multi-layer structure or sheet, as shown in FIGS. 3A and 3B.

The first substrate 1, a motherboard of the electronic device C, provides a first and second surfaces F1 and F2, and several electronic components such as CPUs, microprocessors, RAM, etc., are disposed on the first substrate 1. A rectangular seat 10 is a socket for fixing the process unit 2 on the first surface F1 of the first substrate 1. The process unit 2, an operational unit for processing data of the electronic device C and placed on the seat 10. The process unit 2 is electrically connected to the first substrate 1 via the contacts (not shown in FIGS.) of the seat 10. Four connecting portions 11 are respectively and symmetrically disposed on the first surface F1 of the first substrate 1 near the four corners of the seat 10. Each connecting portion 11 provides two threaded holes 110 located on the first surface F1 and the second surface F2 of the first substrate 1, respectively, but only the threaded hole 110 on the first surface F1 of the first substrate 1 is shown. In this embodiment, the process unit 2 is a CPU.

The heat-dissipating device 3 has a fin structure 30 and four extensions 31. The extensions 31 are radially and symmetrically extended from the fin structure 30, and each extension 31 provides a hole 310 corresponding to the threaded hole 110 of the connecting portion 11.

The second substrate 4 functions as a supporting element or planar support to reinforce the first substrate 1. In this embodiment, the second substrate 4 is star shaped and has a main portion 40 and four arms 41. The main portion 40 is substantially rectangular. The arms 41 are radially and symmetrically extended from the main portion 40, and each arm 41 provides a hole 410 corresponding to the threaded hole 110 of the connecting portion 11.

As the process unit 2 is placed on the seat 10, the heat-dissipating device 3 is attached to the process unit 2 and adjusted so that the hole 310 of the extensions 31 corresponds to the threaded hole 110 of the connecting portion 11. The screws 311 are then respectively fastened to the threaded hole 110 of each connecting portion 11 through the hole 310 of the extensions 31, and thus fixing the heat-dissipating device 3 on the first substrate 1. Heat produced by the process unit 2 is directly transmitted to the heat-dissipating device 3 and dissipated by the fin structure 30.

Then, by fastening the four screws 411 through the holes 410 of the second substrate 4 to the connecting portions 11 on the second surface F2 of the first substrate 1, the second substrate 4 fixed on the connecting portions 11 is completely attached to the second surface F2 of the first substrate 1.

By installing the second substrate 4 on the second surface F2 of the first substrate 1 relative to the process unit 2, the structure of the first substrate 1 is reinforced. Even if the first substrate l is deformed by heat produced by the process unit 2, the contact between the heat-dissipating device 3 and the process unit 2 is sufficient, i.e., no gap or clearance is formed between the heat-dissipating device 3 and the process unit 2. Furthermore, by reinforcing the second substrate 4, peeling of the welded points on the first substrate 1 and overheating are both prevented. Thus, the operation of the host H is stable.

In FIGS. 3A and 3B, a sheet S of a multi-layer structure is a laminated circuit board designed for the first substrate 1 of the electronic device C. As the first substrate 1 is blanketed or cut and separated from the sheet S, the sheet remainder n provides enough area for the formation of the second substrate 4.

Additionally, the outer surface of the sheet S is generally coated with an insulating layer, i.e., the upper surface 40F1 and the lower surface 40F2 of the second substrate 4 and the first surface F1 and the second surface F2 of the first substrate 1 are covered with the same insulating layer. Thus, no additional insulating material or plate is required between the second substrate 4 and the first substrate 1. Additionally, shorts or burnout on the testing points between the first and second substrates 1 and 4 is prevented.

While the invention has been described in connection with what is presently considered to be the most practical and preferred embodiment, it is to be understood that the invention is not limited to the disclosed embodiments, but, on the contrary, is intended to accommodate various modifications and equivalent arrangements included within the spirit and scope of the appended claims.

What is claimed is:

1. An electronic device, comprising:
   a display unit; and
   a host electrically connected to the display unit, comprising a module structure having a first substrate, at least one process unit, at least one heat-dissipating device and at least one second substrate, wherein the process unit is disposed on the first substrate, the heat-dissipating device is disposed on the first substrate relative to the process unit, the second substrate is disposed on the first substrate relative to the process unit, and the second substrate and the first substrate have the same structure and texture.

2. The electronic device as claimed in claim 1, wherein the first substrate and the second substrate are formed from the same material.

3. The electronic device as claimed in claim 1, wherein the first substrate and the second substrate are formed by a multi-layer structure.

4. The electronic device as claimed in claim 1, wherein the first substrate comprises a plurality of connecting portions, and the heat-dissipating device is disposed on the connecting portions.

5. The electronic device as claimed in claim 1, wherein the process unit comprises CPU.

6. The electronic device as claimed in claim 1, wherein the first substrate and the second substrate are formed from the same material.

7. The electronic device as claimed in claim 1, wherein the first substrate and the second substrate are formed by a multi-layer structure.

8. The electronic device as claimed in claim 1, wherein the first substrate comprises a plurality of connecting portions, and the heat-dissipating device is disposed on the connecting portions.

9. The electronic device as claimed in claim 1, wherein the process unit comprises CPU.

10. A module structure of an electronic device, comprising:
    a first substrate;
    a process unit disposed on the first substrate;
    a heat-dissipating device disposed on the first substrate relative to the process unit; and
    a second substrate disposed on the first substrate relative to the process unit, having the same structure and texture as the first substrate.

11. The module structure of the electronic device as claimed in claim 10, wherein the first substrate and the second substrate are formed from the same material.

12. The module structure of the electronic device as claimed in claim 10, wherein the first substrate and the second substrate are formed by a multi-layer structure.

13. The module structure of the electronic device as claimed in claim 10, wherein the first substrate comprises a plurality of connecting portions, and the heat-dissipating device is disposed on the connecting portions.

14. The module structure of the electronic device as claimed in claim 10, wherein the process unit comprises CPU.

15. The module structure of the electronic device as claimed in claim 10, wherein the first substrate and the second substrate are formed from the same material.

16. The module structure of the electronic device as claimed in claim 10, wherein the first substrate and the second substrate are formed by a multi-layer structure.

17. The module structure of the electronic device as claimed in claim 10, wherein the first substrate comprises a plurality of connecting portions, and the heat-dissipating device is disposed on the connecting portions.

18. The module structure of the electronic device as claimed in claim 10, wherein the process unit comprises CPU.

19. An electronic device, comprising:
    a host comprising a module structure having a first substrate, at least one process unit, at least one heat-dissipating device and at least one second substrate, wherein the process unit is disposed on the first substrate, the heat-dissipating device is disposed on the first substrate relative to the process unit, the second substrate disposed on the first substrate relative to the process unit is connected to the heat-dissipating device, and the second substrate and the first substrate have the same structure and texture.

20. A module structure of an electronic device, comprising:
   a first substrate;
   a process unit disposed on the first substrate;
   a heat-dissipating device disposed on the first substrate relative to the process unit; and
   a second substrate disposed on the first substrate relative to the process unit and connected to the heat-dissipating device, wherein the second substrate has the same structure and texture as the first substrate.

* * * * *